United States Patent
Yu et al.

(10) Patent No.: US 8,779,588 B2
(45) Date of Patent: Jul. 15, 2014

(54) BUMP STRUCTURES FOR MULTI-CHIP PACKAGING

(75) Inventors: Chen-Hua Yu, Hsinchu (TW); Jing-Cheng Lin, Chu Tung Zhen (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/427,753

(22) Filed: Mar. 22, 2012

(65) Prior Publication Data

US 2013/0134582 A1    May 30, 2013

Related U.S. Application Data

(60) Provisional application No. 61/564,594, filed on Nov. 29, 2011.

(51) Int. Cl.
*H01L 23/48*    (2006.01)

(52) U.S. Cl.
USPC ............ 257/737; 257/738; 257/780; 257/734

(58) Field of Classification Search
USPC ................ 257/778, 779, 780, 797, 737, 738, 257/E23.068, E23.069, E23.179, 673, 257/E23.021, E27.137; 428/620, 64.1, 428/65.3, 85, 87, 224, 236, 241, 375, 604, 428/614, 630, 41, 6.2, 51, 56.3, 56; 361/760
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,447,264 A * | 9/1995 | Koopman et al. ............ 228/56.3 |
| 5,481,133 A | 1/1996 | Hsu | |
| 5,929,521 A * | 7/1999 | Wark et al. ..................... 257/737 |
| 6,001,493 A * | 12/1999 | Rutledge et al. ............... 428/620 |
| 6,002,177 A | 12/1999 | Gaynes et al. | |
| 6,187,678 B1 | 2/2001 | Gaynes et al. | |
| 6,220,499 B1 * | 4/2001 | Brofman et al. ......... 228/180.22 |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |

(Continued)

FOREIGN PATENT DOCUMENTS

| | | |
|---|---|---|
| JP | 2003309140 | 10/2003 |
| KR | 20050033254 | 4/2005 |

OTHER PUBLICATIONS

Office Action dated Oct. 10, 2013 with English Translation from corresponding application No. KR 10-2012-0094118.

*Primary Examiner* — Steven Loke
*Assistant Examiner* — Mouloucoulaye Inoussa
(74) *Attorney, Agent, or Firm* — Lowe Hauptman & Ham, LLP

(57) ABSTRACT

The mechanisms for forming a multi-chip package described enable chips with different bump sizes being packaged to a common substrate. A chip with larger bumps can be bonded with two or more smaller bumps on a substrate. Conversely, two or more small bumps on a chip may be bonded with a large bump on a substrate. By allowing bumps with different sizes to be bonded together, chips with different bump sizes can be packaged together to form a multi-chip package.

20 Claims, 13 Drawing Sheets

(56) References Cited

U.S. PATENT DOCUMENTS

| | | | | |
|---|---|---|---|---|
| 6,434,016 | B2 | 8/2002 | Zeng et al. | |
| 6,448,661 | B1 | 9/2002 | Kim et al. | |
| 6,461,895 | B1 | 10/2002 | Liang et al. | |
| 6,562,653 | B1 | 5/2003 | Ma et al. | |
| 6,570,248 | B1 * | 5/2003 | Ahn et al. | 257/724 |
| 6,600,222 | B1 | 7/2003 | Levardo | |
| 6,607,938 | B2 | 8/2003 | Kwon et al. | |
| 6,661,085 | B2 | 12/2003 | Kellar et al. | |
| 6,762,076 | B2 | 7/2004 | Kim et al. | |
| 6,790,748 | B2 | 9/2004 | Kim et al. | |
| 6,887,769 | B2 | 5/2005 | Kellar et al. | |
| 6,908,565 | B2 | 6/2005 | Kim et al. | |
| 6,908,785 | B2 | 6/2005 | Kim | |
| 6,924,551 | B2 | 8/2005 | Rumer et al. | |
| 6,943,067 | B2 | 9/2005 | Greenlaw | |
| 6,946,384 | B2 | 9/2005 | Kloster et al. | |
| 6,975,016 | B2 | 12/2005 | Kellar et al. | |
| 7,037,804 | B2 | 5/2006 | Kellar et al. | |
| 7,056,807 | B2 | 6/2006 | Kellar et al. | |
| 7,087,538 | B2 | 8/2006 | Staines et al. | |
| 7,151,009 | B2 | 12/2006 | Kim et al. | |
| 7,157,787 | B2 | 1/2007 | Kim et al. | |
| 7,215,033 | B2 | 5/2007 | Lee et al. | |
| 7,276,799 | B2 | 10/2007 | Lee et al. | |
| 7,279,795 | B2 | 10/2007 | Periaman et al. | |
| 7,307,005 | B2 | 12/2007 | Kobrinsky et al. | |
| 7,317,256 | B2 * | 1/2008 | Williams et al. | 257/777 |
| 7,320,928 | B2 | 1/2008 | Kloster et al. | |
| 7,345,350 | B2 | 3/2008 | Sinha | |
| 7,402,442 | B2 | 7/2008 | Condorelli et al. | |
| 7,402,515 | B2 | 7/2008 | Arana et al. | |
| 7,410,884 | B2 | 8/2008 | Ramanathan et al. | |
| 7,432,592 | B2 | 10/2008 | Shi et al. | |
| 7,494,845 | B2 | 2/2009 | Hwang et al. | |
| 7,528,494 | B2 | 5/2009 | Furukawa et al. | |
| 7,531,890 | B2 | 5/2009 | Kim | |
| 7,557,597 | B2 | 7/2009 | Anderson et al. | |
| 7,576,435 | B2 | 8/2009 | Chao | |
| 7,834,450 | B2 | 11/2010 | Kang | |
| 2006/0267188 | A1 * | 11/2006 | Ishino et al. | 257/723 |
| 2007/0013063 | A1 * | 1/2007 | Khandekar et al. | 257/734 |
| 2008/0315409 | A1 * | 12/2008 | Cordes et al. | 257/737 |
| 2011/0068465 | A1 * | 3/2011 | Shen et al. | 257/737 |
| 2011/0092064 | A1 | 4/2011 | Liu et al. | |
| 2011/0101527 | A1 | 5/2011 | Cheng et al. | |

* cited by examiner

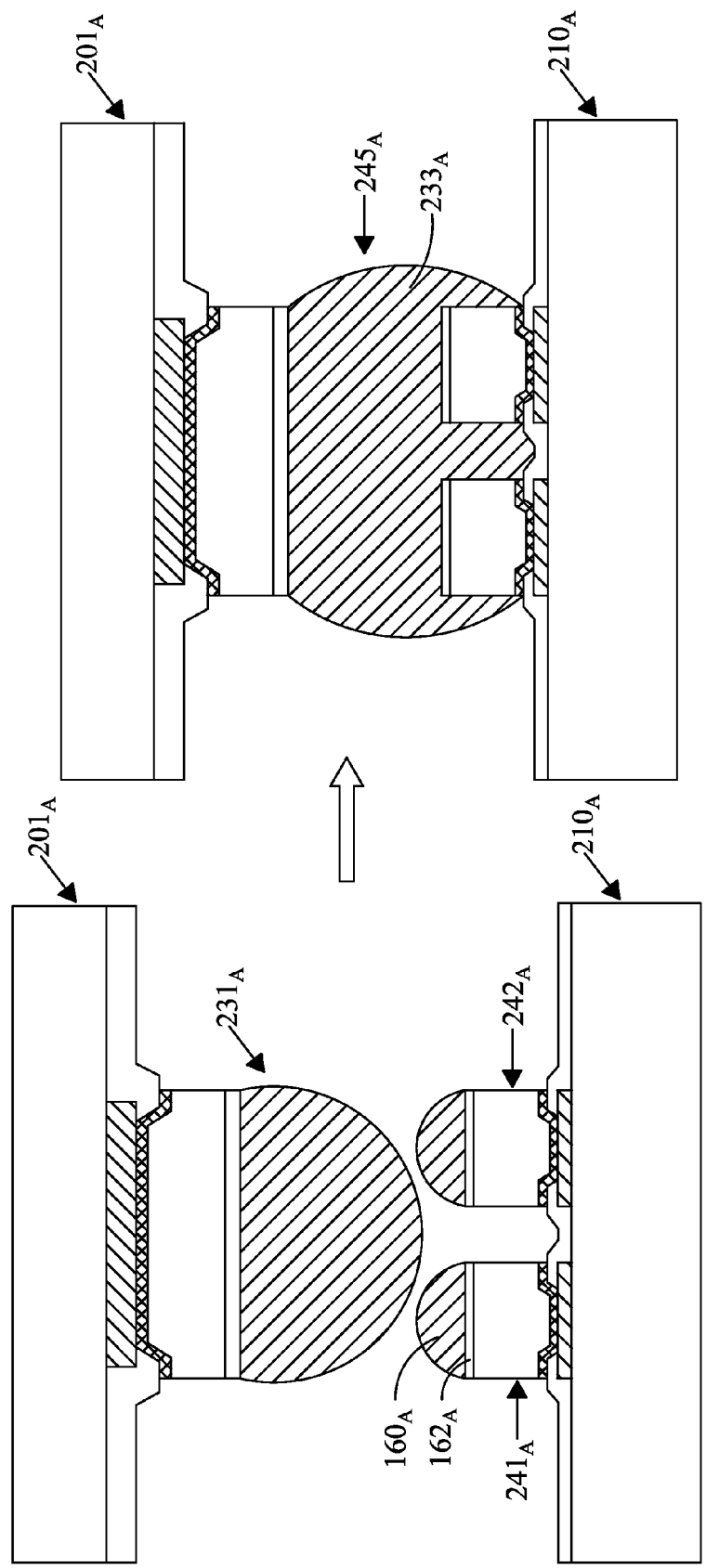

US 8,779,588 B2

BUMP STRUCTURES FOR MULTI-CHIP PACKAGING

CROSS-REFERENCE TO RELATED APPLICATION

The present application claims priority of U.S. Provisional Patent Application No. 61/564,594 filed on Nov. 29, 2011, which is incorporated herein by reference in its entirety.

BACKGROUND

The fabrication of modern circuits involves several steps. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips, and to connect interior integrated circuits to exterior connections.

In packaging integrated circuit (IC) chips, solder joining is one of the commonly used methods for bonding IC chips to package substrates, which may or may not include integrated circuits and/or other passive components. In packaging processes, a semiconductor die (or chip) may be mounted on a package substrate using flip-chip bonding. The package substrate may be an interposer that includes metal connections for routing electrical signals between opposite sides. Other types of substrates may also be used. The die may be bonded to the substrate through direct metal bonding, solder bonding, or the like. There are many challenges in chip packaging.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3A and 3B show cross sectional views of a process sequence for forming bump structures between a chip and a substrate, in accordance with some embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1A:
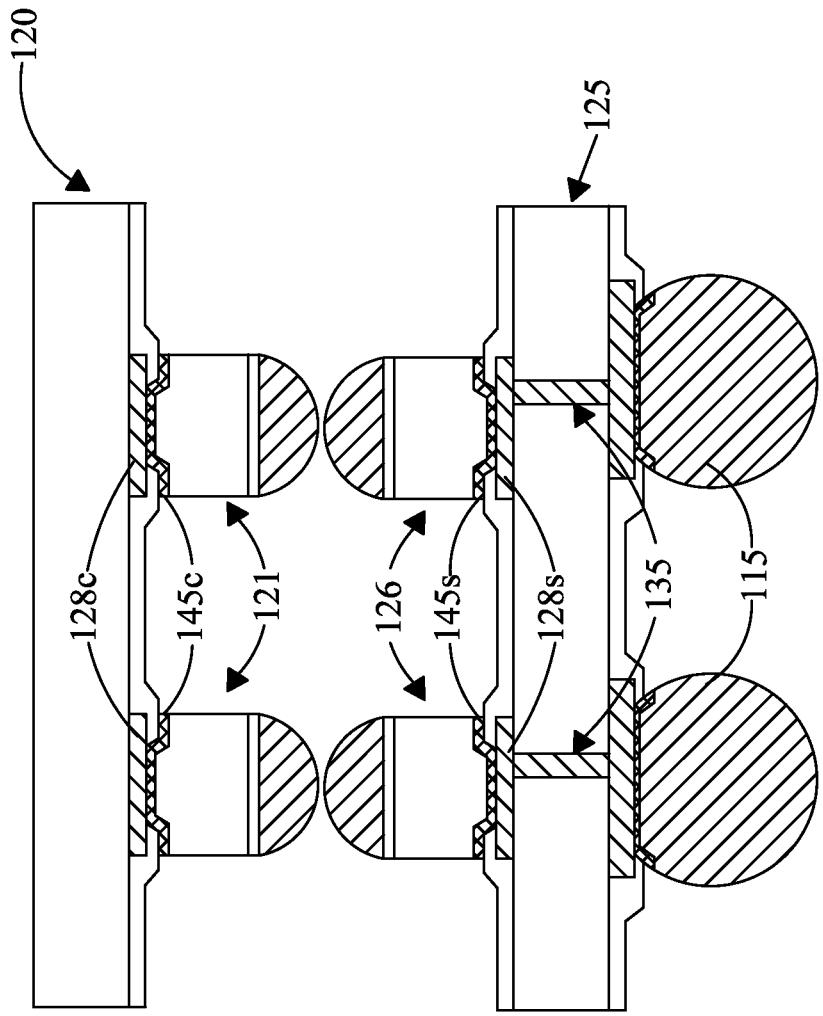
FIGS. 1A and 1B show cross sectional views of a process sequence for forming bump structures between an integrated circuit (IC) die (or chip) and a substrate, in accordance with some embodiments.

FIG. 1A shows a cross sectional view of an integrated circuit (IC) die (or chip) 120 and a substrate 125 after bumps 121 and 126 are formed respectively, in accordance with some embodiments. Bumps 121 and 126 are connected to metal pads $128_C$ and $128_S$ via under bump metallurgy (UBM) layers $145_C$ and $145_S$ respectively, as shown in FIG. 1A. Bumps 121 are aligned with bumps 126 for bonding. The width of bumps 121 is W. In some embodiments, the width of bumps 126 is about the same as the width of bumps 121. Substrate 125 may be a semiconductor wafer, or a portion of a wafer. Substrate 125 may include silicon, gallium arsenide, silicon on insulator ("SOI") or other similar materials. Substrate 125 may also include passive devices such as resistors, capacitors, inductors and the like, or active devices such as transistors. Substrate 125 may be an interposer and may further include through substrate vias (TSVs) 135, as shown in FIG. 1A. In addition, the substrate 125 may also be of other materials in alternative embodiments. For example, multiple layer circuit boards may be used. Substrate 125 may also include bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive the connector terminals 115 for the flip-chip IC die 120.

Figure 1B:
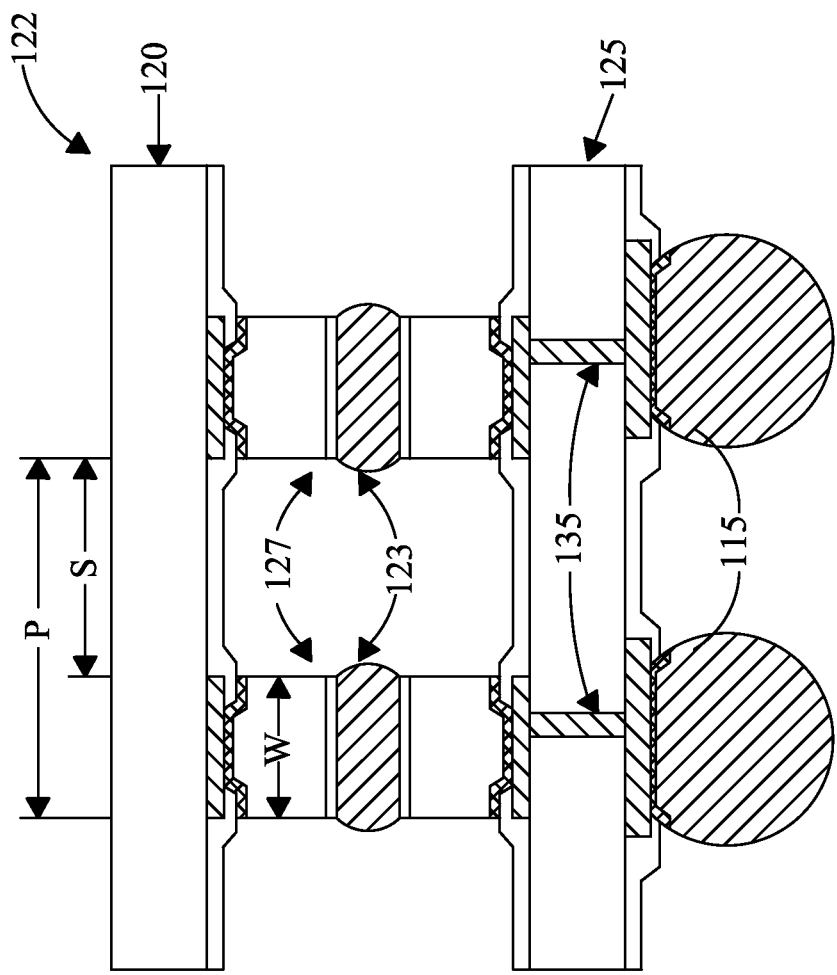

FIG. 1B shows a cross-sectional view of chip 120 bonded to substrate 125 to form package 122, in accordance with some embodiments. Bumps 121 and 126 are joined together by a solder layer 123, which is formed of solder from bumps 121 and 126, to form bump structures 127. The bump structures 127 in FIG. 1B have a pitch P and a spacing (or distance) S between bumps 127.

For advanced packaging of IC dies with many function circuitries, the sizes of bumps 121 and 126 are relatively small to enable more bumps to connect to an input/output (I/O) of chip 120. In some embodiments, the widths of bumps 121 and 126 are in a range from about 5 µm to about 40 µm, in accordance with some embodiments. Such bumps may also be called micro-bumps. In some other embodiments, the widths of bumps 121 and 126 are smaller and range from about 2 µm to about 10 µm. Micro-bumps may include copper posts and may be called copper post (or pillar) bumps. The pitch P of bumps (micro-bumps) 121 and 126 are in a range from about 10 µm to about 60 µm, in accordance with some embodiments. The spacing S of bumps (micro-bumps) 121 and 126 are in a range from about 5 µm to about 30 µm, in accordance with some embodiments. In some other embodiments, when the widths of bumps 121 and 126 ranges from about 2 µm to about 10 µm, the spacing S of bumps (micro-bumps) 121 and 126 ranges from about 1.5 µm to about 10 µm.

Figure 1C:
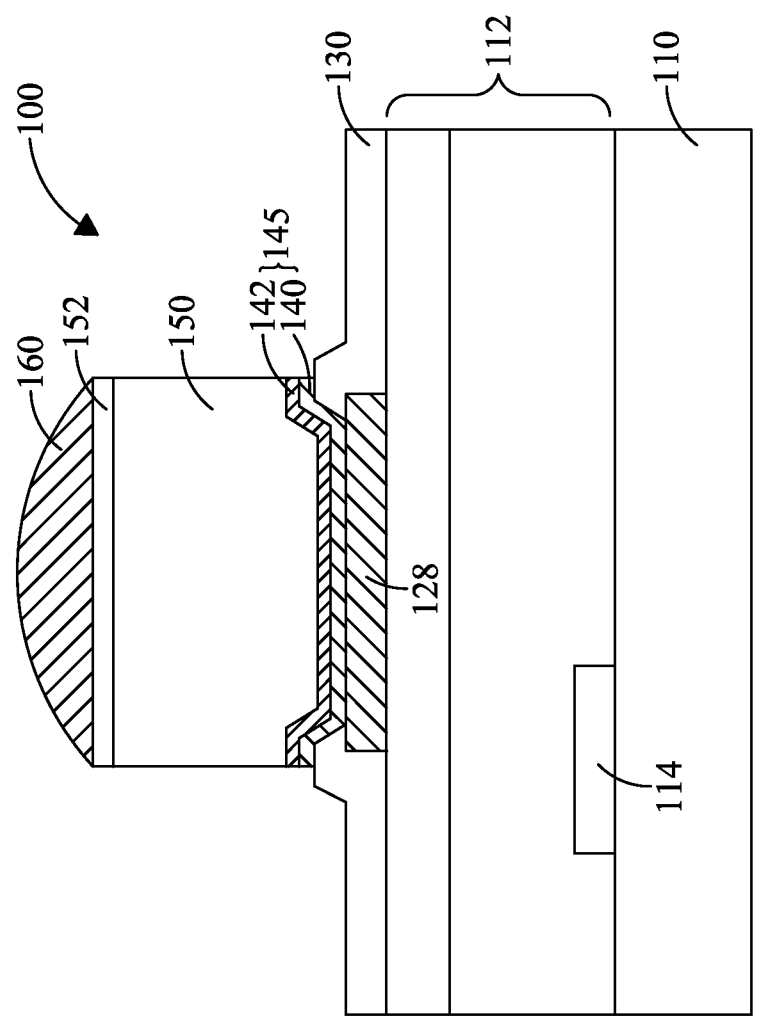
FIGS. 1C and 1D show cross-sectional views of two bump structures, in accordance with some embodiments.

FIG. 1C shows a bump structure 100 with a substrate 110, in accordance with some embodiments. Substrate 110 may be a semiconductor substrate, such as a bulk silicon substrate, although it may include other semiconductor materials, such as group III, group IV, and/or group V elements. Substrate 110 may include silicon, gallium arsenide, silicon on insulator ("SOI") or other similar materials. Semiconductor devices 114, such as transistors, may be formed at the surface of substrate 110. Substrate 110 may also include passive devices such as resistors, capacitors, inductors and the like, or active devices such as transistors. Substrate 100 may, in an exemplary embodiment, include additional integrated circuits. Substrate 110 may be an interposer. In addition, the substrate 110 may also be of other materials in alternative embodiments. For example, multiple layer circuit boards may be used. Substrate 110 may also include bismaleimide triazine (BT) resin, FR-4 (a composite material composed of woven fiberglass cloth with an epoxy resin binder that is flame resistant), ceramic, glass, plastic, tape, film, or other supporting materials.

An interconnect structure 112, which includes metal lines and vias (not shown) formed therein and connected to semiconductor devices 114, is formed over substrate 110. The metal lines and vias may be formed of copper or copper alloys, and may be formed using the well-known damascene processes. Interconnect structure 112 may include commonly known inter-layer dielectrics (ILDs) and inter-metal dielectrics (IMDs).

A metal pad 128 is formed over interconnect structure 112. Metal pad 128 may comprise aluminum, and hence may also be referred to as aluminum pad 128, although it may also be formed of, or include, other materials, such as copper, silver, gold, nickel, tungsten, alloys thereof, and/or multi-layers thereof. Metal pad 128 may be electrically connected to semiconductor devices 114, for example, through underlying interconnection structure 112. The metal pad 128 may be a top metal layer or a redistribution layer (RDL). In some embodiments, a passivation layer 130 is formed to cover edge portions of metal pad 128. The passivation layer 130 may be formed of polyimide or other suitable dielectric materials. Additional passivation layers may be formed over interconnect structure 112 and at the same level, or over, metal pad 128. The additional passivation layers may be formed of materials such as silicon oxide, silicon nitride, un-doped silicate glass (USG), polyimide, and/or multi-layers thereof.

The bump structure 100 includes a diffusion barrier layer 140 and a thin seed layer 142, in accordance with some embodiments. Diffusion barrier layer 140 may be a titanium layer, a titanium nitride layer, a tantalum layer, or a tantalum nitride layer. The materials of seed layer 142 may include copper or copper alloys, and hence is referred to as copper seed layer 142 hereinafter. However, other metals, such as silver, gold, aluminum, and combinations thereof, may also be included. The combined diffusion barrier layer 140 and copper seed layer 142 may also be referred to as an under bump metallurgy (UBM) layer 145.

In some embodiments, bump structure 100 also includes a copper layer 150, a metal layer 152, and a solder layer 160. The copper layer 150, the metal layer 152, and the solder layer 160 are formed by plating with a photo mask defining the openings, in accordance with some embodiments. In some embodiments, metal layer 152 is a nickel-containing layer comprising, for example, a nickel layer or a nickel alloy layer by plating. Metal layer 152 prevents the formation of an inter-metallic compound (IMC) between copper and solder. Solder layer 160 may be a lead-free pre-solder layer formed of, for example, SnAg, or a solder material, including alloys of tin, lead, silver, copper, nickel, bismuth, or combinations thereof. In FIG. 1A, the solder layer 160 is rounded as a result of reflow. In some embodiments, bump structure 100 does not include solder layer 160. In some embodiments, bump structure 100 does not include solder layer 160 and metal layer 152.

When the thickness of copper layer 150 is larger than the thickness of solder layer 160, the bump structure is referred to as a copper post (or pillar) bump. For advanced chip packaging, the bump pitch and bump width are reduced. Copper post bump enables reduction of bump pitch and width. The embodiment shown in FIG. 1A is merely an example; other embodiments of bumps are also possible. Further details of bump formation process may be found in U.S. patent application Ser. No. 12/842,617, filed on Jul. 23, 2010 and entitled "Preventing UBM Oxidation in Bump Formation Processes," and U.S. patent application Ser. No. 12/846,353, filed on Jul. 29, 2010 and entitled "Mechanisms for Forming Copper Pillar Bumps," both of which are incorporated herein in their entireties.

Figure 1D:
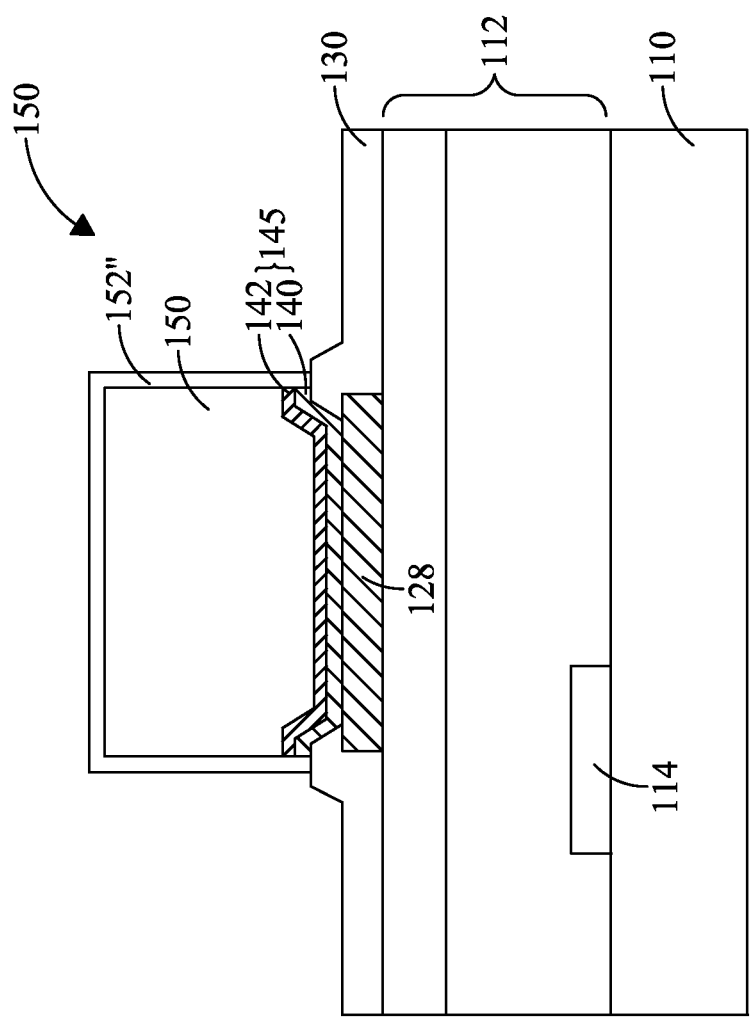

FIG. 1D shows a bump structure 150, in accordance with some other embodiments. Bump structure 150 has many features similar to bump structure 100. The same numbering is used for similar layers or structures. Bump structure 150 does not have solder layer 160. In addition, the metal layer 152" is formed to cap an entire surface of copper layer 150. Copper layer 150 formed after the UBM layer 145 and extending from the boundary of copper layer 150 has been removed.

Figure 2A:
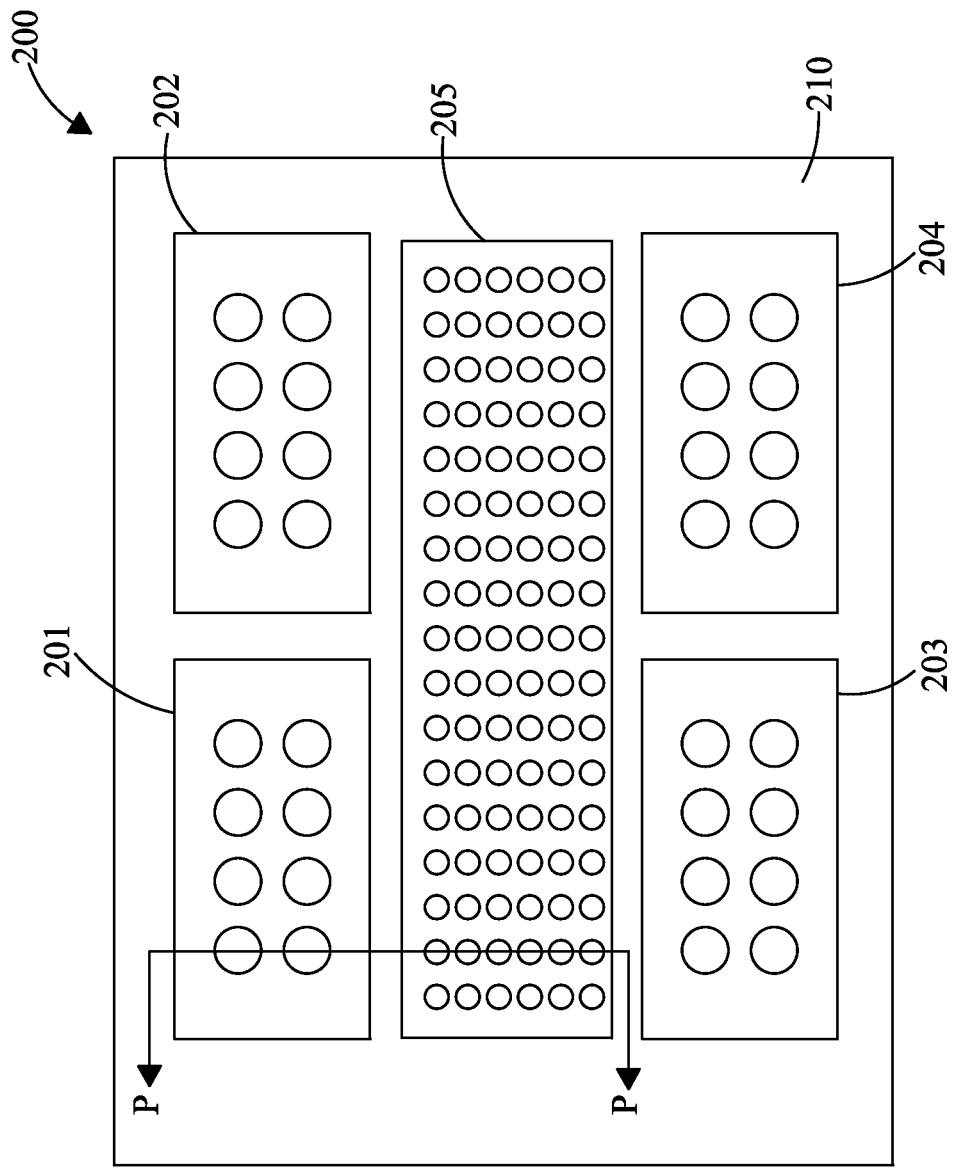
FIG. 2A shows a top view of a multi-chip package with a number of chips bonded to a substrate, in accordance with some embodiments.

With the increased popularity of handheld electronic devices, memory chips are packaged with logic chip(s) to improve the package form factor. A chip package with more than one chip is called multi-chip package. Some chips, such as memory chips, have lower counts of input/output (I/O) connections. Such chips are manufactured with larger bumps, due to the relatively lower number of I/O connections needed. In addition, larger bumps are easier to make and can be made by less advanced processing technologies. FIG. 2A shows a top view of a multi-chip package 200 with a number of chips 201-205 bonded to a substrate 210, in accordance with some embodiments. Substrate 210 has bumps to bond with bumps on chips 201-205. Although in some embodiments the bumps on substrate 210 have different sizes, the manufacturing process is more complicated and more expensive as the number of different sized bumps increases. As a result, in some embodiments, the bumps on substrate 210 have about the same sizes.

Chips 201-204 are chips with low numbers of I/O connections (bumps), such as memory chips compared to chip 205 with higher number of bumps. For example, chip 205 could be a logic chip, which needs a large number of I/O connections to achieve its functions. As a result, bumps with fine pitches and sizes, such as micro-bumps, are used for external connections. In contrast, memory chips 201-204 do not need such bumps, since the number of bumps needed are much lower. It is also possible to make the bump sizes and pitches for memory chips 201-204 to be the same as those for logic chip 205; however, not every memory manufacturer has the capability or capacity to make smaller bumps, such as micro-bumps. It is a challenge to bond chips with different bump sizes on a single substrate.

Figure 2B:
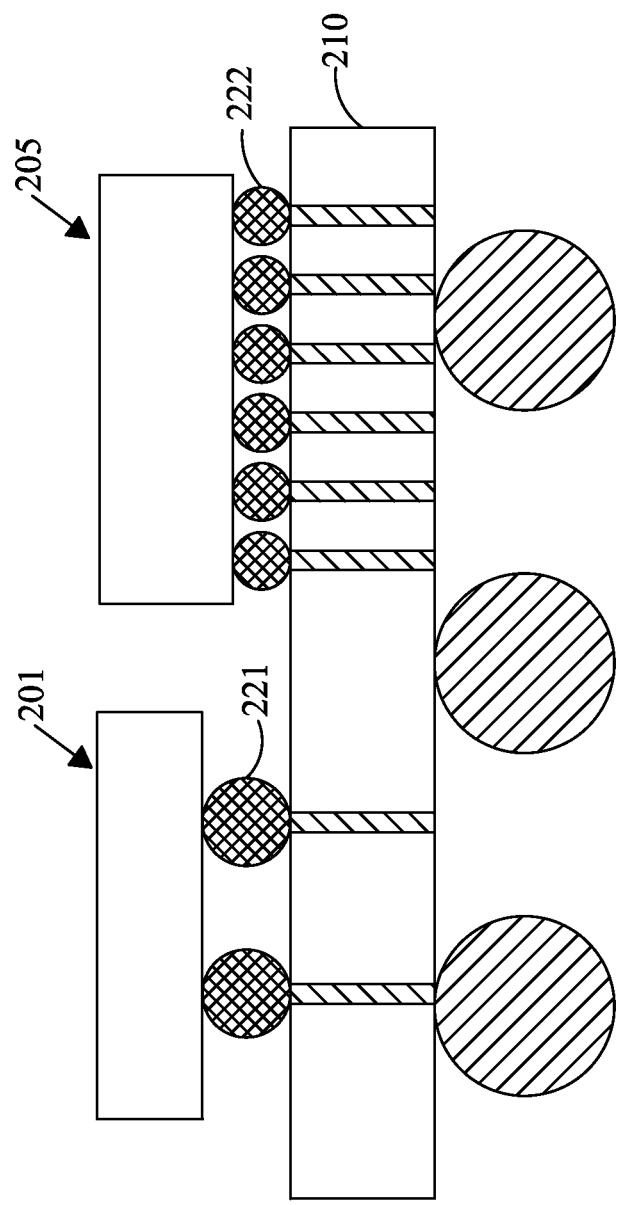
FIG. 2B shows a cross-sectional view of a portion of the multi-chip package of FIG. 2A cut along line P-P, in accordance with some embodiments.

FIG. 2B shows a cross-sectional view of a portion of multi-chip package 200 of FIG. 2A cut along line P-P, in accordance with some embodiments. FIG. 2B shows that chip 201 mounted on substrate 210 with larger bump structures 221 than the bump structures 222 for chip 205. Although FIG. 2B shows that chips 201 and 205 are at the same height after bonding, this is not a requirement. Chips 201 and 205 could be at different heights after bonding. Bump structures 221 and 222 are represented by round shapes in FIG. 2B for simplicity. An exemplary bump structure 222 is bump structure 127, whose formation process has been described above and shown in FIGS. 1A and 1B. Details of how to form bump structures 221 are described below.

Figure 2C:
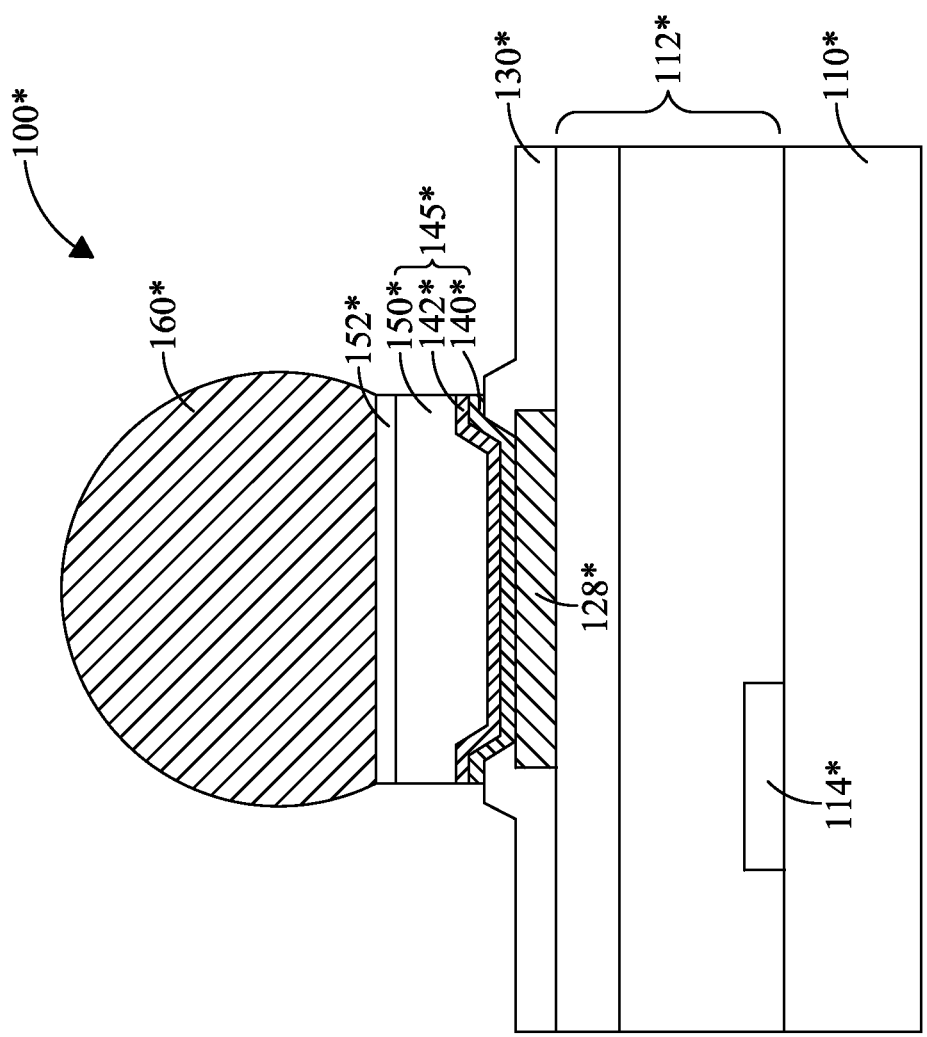
FIGS. 2C and 2D show cross-sectional views of two bump structures, in accordance with some embodiments.

FIG. 2C shows a cross-sectional view of a flip-chip bump 100* for chip 201, in accordance with some embodiments. The various layers in flip-chip bump 100* are similar to those of micro-bump 100 (FIG. 1C) described above. The width of bump 100* is larger than bump 100, which is a micro-bump in accordance with some embodiments. In some embodiments, the width of bump 100\* is greater than about 40 µm and equal to or less than about 120 µm. Bumps 100\* may also be called C4 bump. C4 stands for controlled collapse chip connection. In addition, the ratio of the thickness of copper layer 150\* to the thickness of solder layer 160\* of bump 100\* is different from the ratio for bump 100. Bump 100\* has a solder layer 160\* thicker than the copper layer 150\* and is not a copper post bump. In contrast, micro-bump 100 is a copper post bump with copper layer 150 being thicker than solder layer 160. In some embodiments, the thickness of copper layer 150\* of bump 100\* is in a range from about 5 µm to about 50 µm. The thickness of solder layer 160\* is in a range from about 15 µm to about 60 µm, in accordance with some embodiments.

Figure 2D:
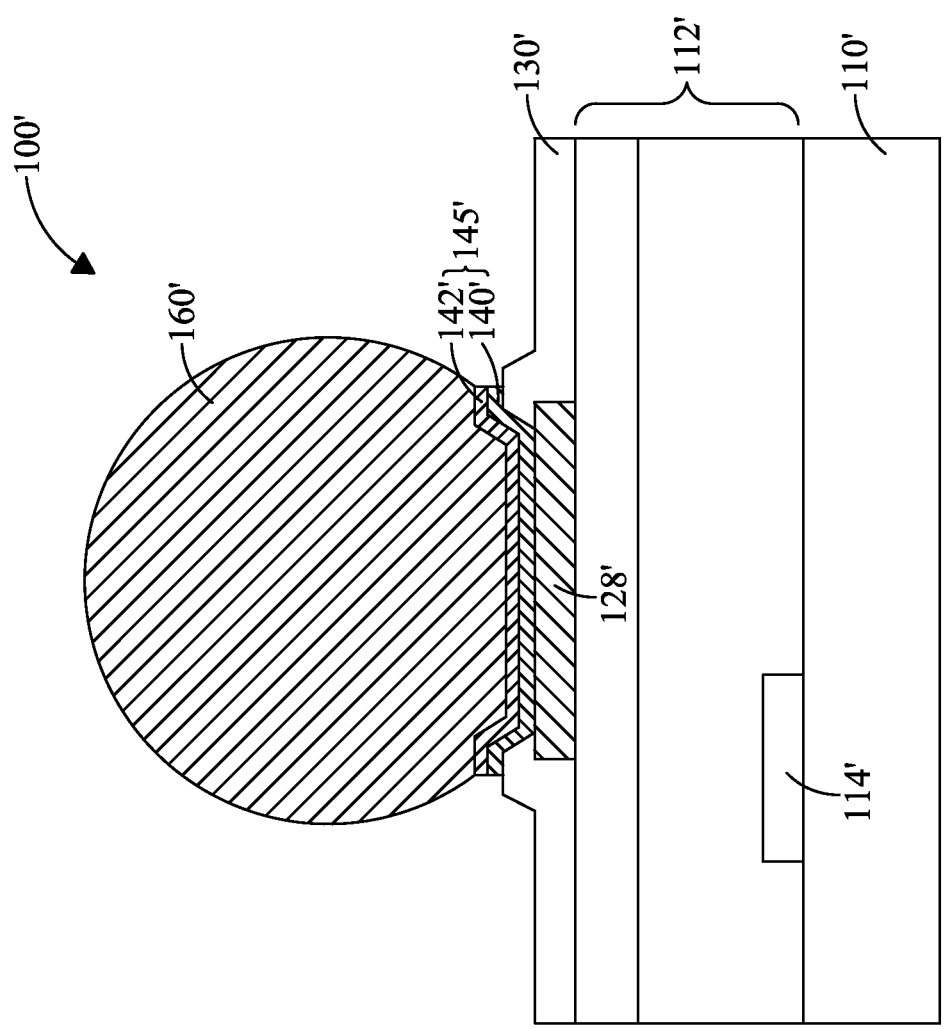

FIG. 2D shows a cross-sectional view of a flip-chip bump 100' for chip 201, in accordance with some embodiments. The various layers in flip-chip bump 100' are similar to those of bump 100\* described above. However, bump 100' does not have copper layer 150\* and metal layer 152\* of FIG. 2C. The solder layer 160' is directly deposited on UBM layer 145'. The solder layer 160' is rounded due to reflow. In some embodiments, the UBM layer 145' does not include the copper seed layer 142'. The range of width of flip-chip 100' is similar to flip-chip 100\*. In some embodiments, the thickness of solder layer 160' is in a range from about 15 µm to about 120 µm.

FIG. 3A shows a cross-sectional view of chip 201$_A$ with a bump 231$_A$ being placed above substrate 210$_A$ with micro-bumps 241$_A$ and 242$_A$, in accordance with some embodiments. Bump 231$_A$ has a structure described in FIG. 2C. The structures of micro-bumps 241$_A$ and 242$_A$ have been described in FIG. 1C. In some embodiments, micro-bumps 241$_A$ and 242$_A$ do not have solder layer 160$_A$ and metal layer 152$_A$. Chip 201$_A$ and substrate 210$_A$ are then pressed together to allow bump 231$_A$ to come in contact with micro-bumps 241$_A$ and 242$_A$. Afterwards, the solder layers of the bumps 231$_A$, 241$_A$, and 242$_A$ are reflowed to form a single layer (or entity) 233$_A$, which is part of bump structure 245$_A$ as shown in FIG. 3B, in accordance with some embodiments. By using more than one micro-bump, bumps 241$_A$ and 242$_A$, of substrate 210$_A$ to contract flip-chip bump 231$_A$ of chip 201$_A$, the bump structure 245$_A$ is stronger than a bump structure involving only one single micro-bump (with only bump 241$_A$ or bump 242$_A$). In addition, micro-bumps 241$_A$ and 242$_A$ can share the burden of carrying current to or from bump 231$_A$.

Figure 3C:
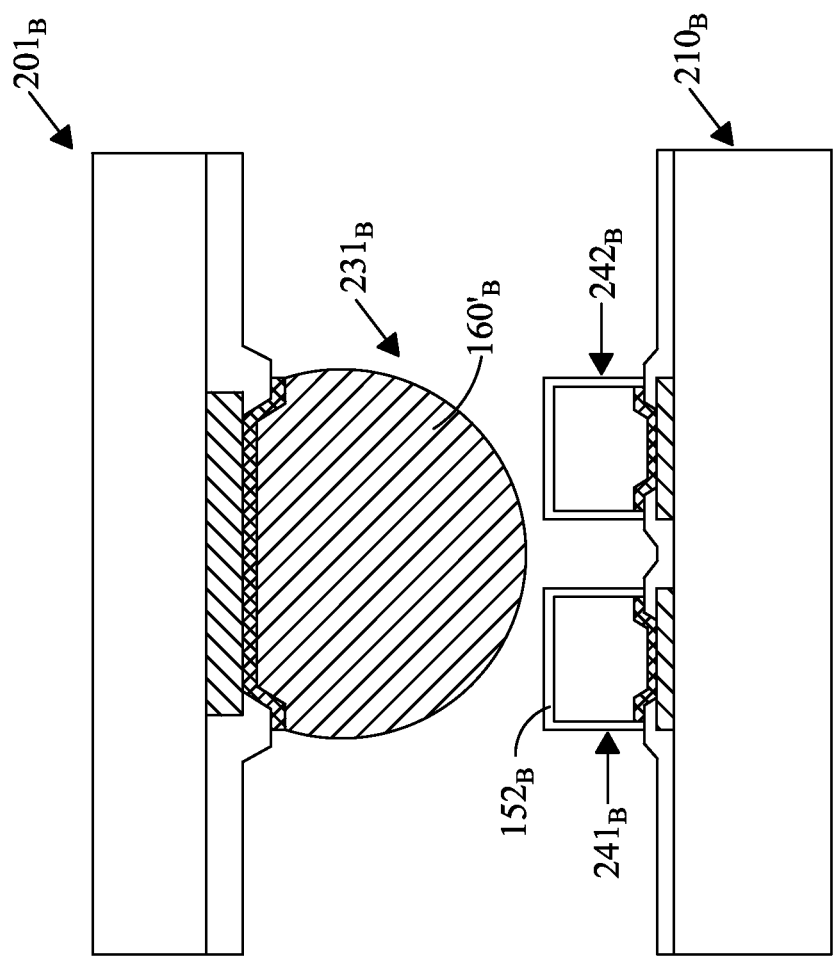
FIGS. 3C and 3D show cross sectional views of a process sequence for forming bump structures between a chip and a substrate, in accordance with some embodiments.
Figure 3D:
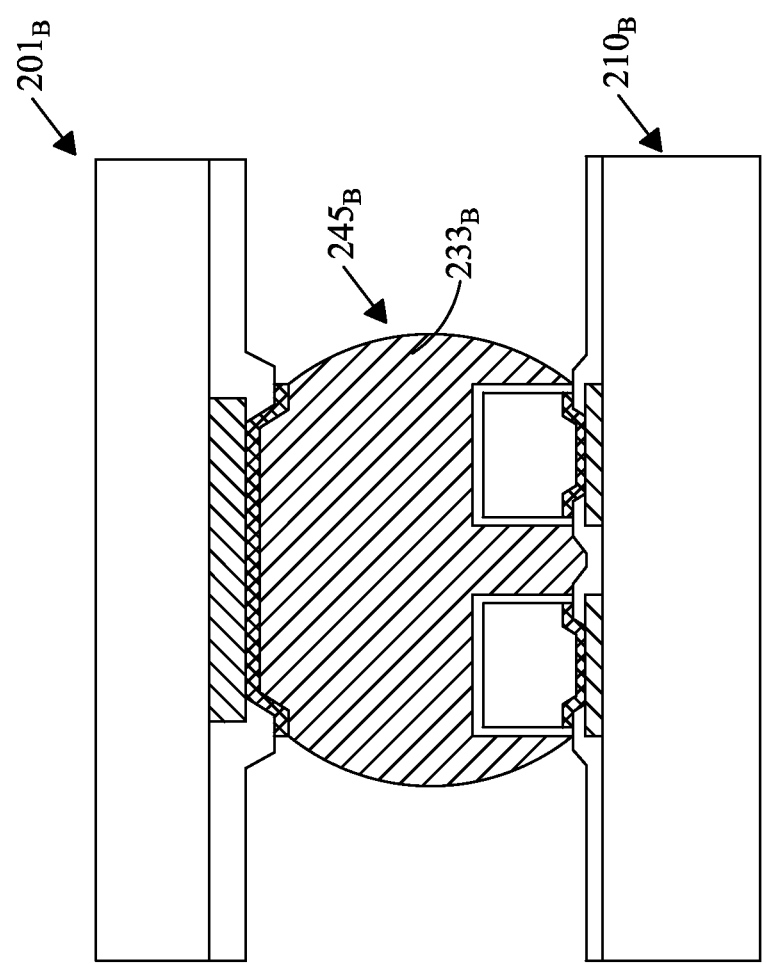

FIG. 3C shows a cross-sectional view of chip 201$_B$ with a bump 231$_B$ being placed above substrate 210$_B$ with micro-bumps 241$_B$ and 242$_B$, in accordance with some embodiments. Bump 231$_B$ has a structure described in FIG. 2D. The structures of micro-bumps 241$_B$ and 242$_B$ have been described in FIG. 1D. In some embodiments, 241$_B$ and 242$_B$ do not have metal layer 152$_B$. Chip 201$_B$ and substrate 210$_B$ are then pressed together to allow bumps 231$_B$ to come in contact with micro-bumps 241$_B$ and 242$_B$. Afterwards, the solder layer 160$_B$ of the bump 231$_B$ is reflowed to become layer 233$_B$, which surrounds micro-bumps 241$_B$ and 242$_B$, and forms bump structure 245$_B$, as shown in FIG. 3D, in accordance with some embodiments. The bumps on chips and substrates and bump structures formed described in FIGS. 3A-3D are merely examples. Other types or bumps and combinations of bumps on chips and substrates may also be used to formed different variation of bump structures.

Figure 3E:
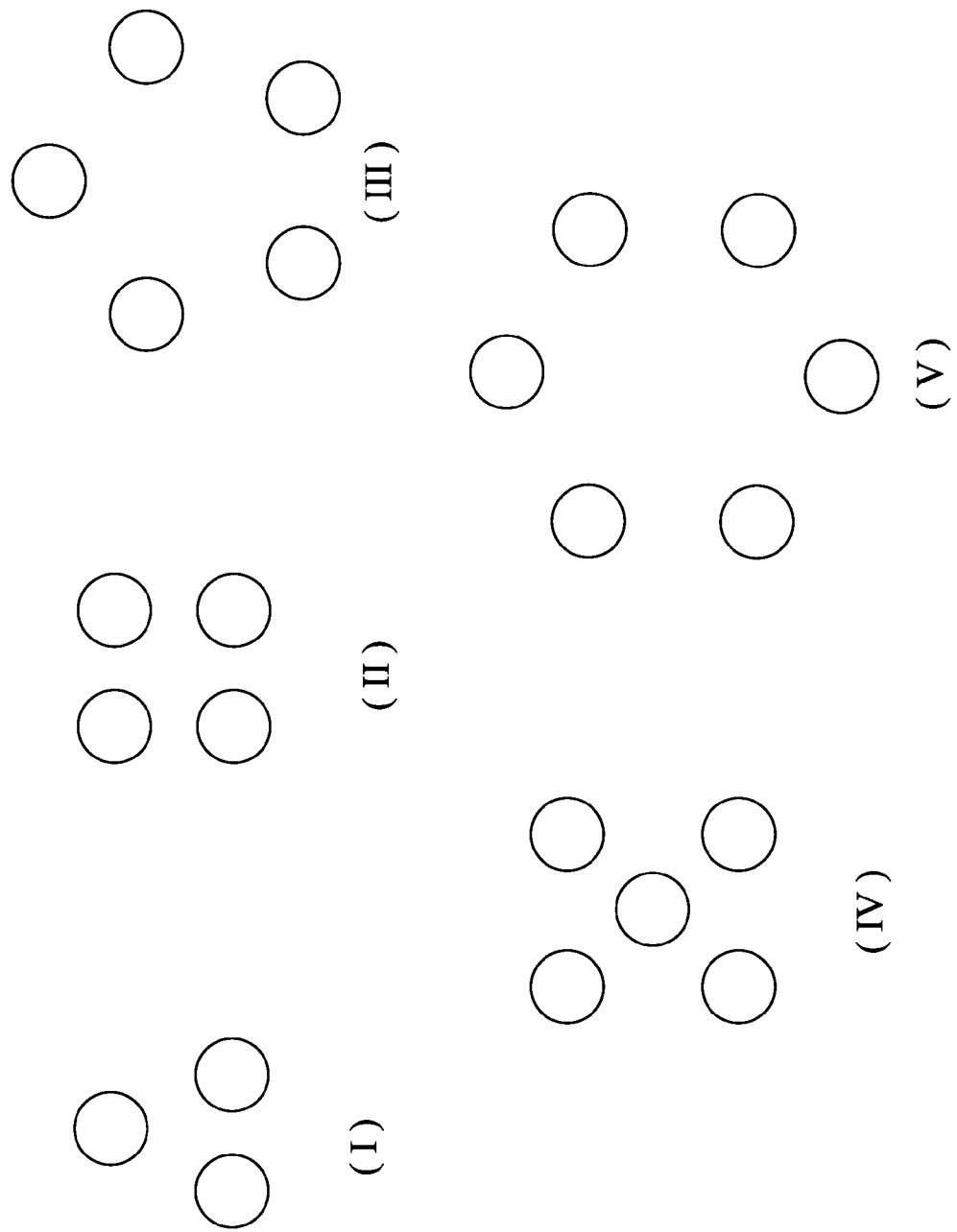
FIG. 3E shows top views of different numbers and arrangements of micro-bumps for bonding to a larger flip-chip bump, in accordance with some embodiments.

The bump structures 245A and 245B described above in FIGS. 3B and 3D involved only two micro-bumps in each structure. Alternatively, more than two micro-bumps may be used to connect with a flip-chip bump. FIG. 3E shows exemplary top views of different numbers and arrangements of micro-bumps for bonding to a larger flip-chip bump. FIG. 3E (I) shows 3 micro-bumps spaced evenly. FIG. 3E (II) shows 4 micro-bumps spaced evenly. FIGS. 3E (III) and (IV) show two different arrangements of 5 micro-bumps for bonding with a flip-chip bump. FIG. 3E (V) shows 6 micro-bumps spaced evenly. However, un-evenly spaced micro-bumps may also be used. The numbers and arrangements of micro-bumps shown in FIG. 3E area merely examples. Additional numbers and/or different arrangements of micro-bumps may also be used.

Although chips 201-204 of FIGS. 2A and 2B and chips 201$_A$ and 201$_B$ of FIGS. 3A-3D are described above as memory chips, chips 201-204 and chips 201$_A$ and 201$_B$ could be any chips with flip-chip bumps larger than the bumps on chip 205. The mechanism of forming a bump structure by bonding a large bump with two or more smaller bumps can be applied to various packaged devices. The smaller bumps on the substrate 210, 210$_A$, and/or 210$_B$ do not need to be micro-bumps. They just need to be smaller than bumps on chips 201-204, 201$_A$ and 210$_B$. The mechanisms can apply for bonding bumps on chips with bumps having different sizes on substrates. For example, the larger bump could be a micro-bump with a width in a range from about 10 µm to about 40 µm and the smaller bumps could be bumps smaller than micro-bumps, with a width in a range from about 2 µm to about 10 µm. Two or more such bumps that are smaller than micro-bumps may be bonded to a micro-bump in mechanisms described above.

Figure 4:
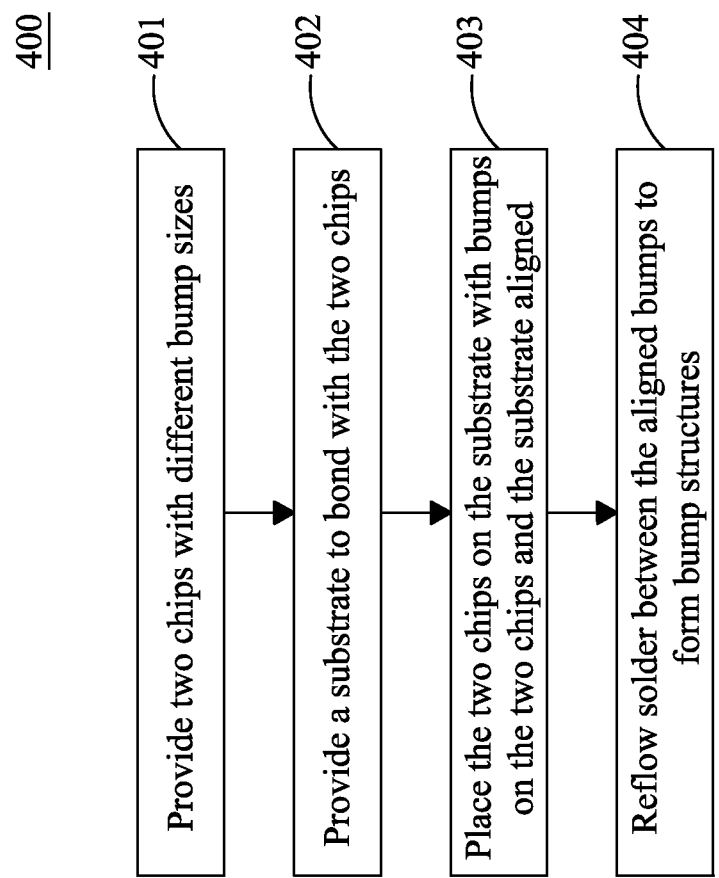
FIG. 4 shows a process flow of forming a multi-chip package, in accordance with some embodiments.

FIG. 4 shows a process flow 400 of forming a multi-chip package, in accordance with some embodiments. At operation 401, two chips with different bump sizes are provided. Each of the bumps on a chip are about the same size. One chip has a bump size much larger than a bump size of the other chip, such as equal to or greater than about 1.5 times. At operation 402, a substrate for bonding with the two chips is provided. The substrate has bumps with sizes about the same as the chip with smaller bumps. In some embodiments, the pitch(es) of the bumps on the substrate are about the same as the pitch(es) on the chip with smaller bumps. The order of operations 401 and 402 can be reversed. At operation 403, the chips are placed on the substrate with the bumps on the chips aligned above the bumps on the substrate. Each of the bumps on the chip with larger bumps are disposed above more than one bumps on the substrate. Afterwards, at operation 404, the bumps are pressed together and the solder between the aligned bumps are reflowed to form bump structures between the chips and the substrate. A multi-chip package is thus formed. Additional processing may be performed to complete the packaging process. For example, underfill may be formed to fill the space between the chips and the substrate.

The mechanisms for forming a multi-chip package described above enable chips with different bump sizes being packaged to a common substrate. A chip with larger bumps can be bonded with two or more smaller bumps on a substrate. Conversely, two or more small bumps on a chip may be bonded with a large bump on a substrate. By allowing bumps with different sizes to be bonded together, chips with different bump sizes can be packaged together to form a multi-chip package.

In accordance with some embodiments, a chip package is provided. The chip package includes a first bump structure between a first chip and a substrate of the chip package. A first solder layer of the first bump structure covers more than one bump on the substrate.

In accordance with some embodiments, a multi-chip package is provided. The multi-chip package includes a first bump structure between a first chip and a substrate of the chip package, and a first solder layer of the first bump structure covers more than one bump on the substrate. The multi-chip package also includes a second chip on the chip package, and there is a second bump structure between the second chip and the substrate. A solder layer of the second bump structure connects a bump on the substrate with a bump on the second chip.

In accordance with some embodiments, a method of forming a chip package is provided. The method includes providing a first chip with a C4 bump, and providing a substrate with a plurality of bumps. The method also includes forming a first bump structure by bonding the C4 bump with the plurality of bumps of the substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A chip package, comprising:
   a first bump structure between a first chip and a substrate of the chip package, wherein a first solder layer of the first bump structure surrounds more than one bump on the substrate, and the solder layer covers an entirety of each sidewall of each bump of the more than one bump.

2. The chip package of claim 1, wherein the first bump structure includes one bump of the first chip.

3. The chip package of claim 1, wherein there is a second chip on the chip package, and wherein there is a second bump structure between the second chip and the substrate, wherein a solder layer of the second bump structure connects a bump on the substrate with a bump on the second chip.

4. The chip package of claim 3, wherein the more than one bump of the first bump structure and the bump on the substrate of the second bump structure are about the same size.

5. The chip package of claim 1, wherein widths of the more than one bump on the substrate are in a range from about 5 μm to about 30 μm.

6. The chip package of claim 1, wherein the more than one bump on the substrate includes 2, 3, 4, 5, 6, 7, or 8 bumps.

7. The chip package of claim 2, where the bump on the first chip has a width greater than about 40 μm and equal to or less than about 120 μm.

8. The chip package of claim 1, the first chip is memory chip.

9. The chip package of claim 1, wherein the substrate is an interposer.

10. The chip package of claim 9, wherein the more than one bump on the substrate includes a copper post bump.

11. The chip package of claim 2, wherein the bump on the first chip is a controlled collapse chip connection (C4) bump including at least a copper layer.

12. The chip package of claim 1, wherein widths of the more than one bump on the substrate are in a range from about 2 μm to about 10 μm and where a bump on the first chip has a width greater than about 10 μm and equal to or less than about 40 μm.

13. A multi-chip package, comprising:
   a first bump structure between a first chip and a substrate of the chip package, wherein a first solder layer of the first bump structure surrounds more than one bump on the substrate, and the solder layer covers an entirety of each sidewall of each bump of the more than one bump; and
   a second chip on the chip package, and wherein there is a second bump structure between the second chip and the substrate, wherein a solder layer of the second bump structure connects a bump on the substrate with a bump on the second chip.

14. A method of forming a chip package, comprising:
   providing a first chip with a C4 bump;
   providing a substrate with a plurality of bumps; and
   forming a first bump structure by bonding the C4 bump with at least two bumps of the plurality of bumps of the substrate, wherein the C4 bump surrounds at least two bumps of the plurality of bumps, and the C4 bump covers an entirety of each sidewall of each bump of the at least two bumps.

15. The method of claim 14, further comprising:
   providing a second chip with a copper post bump; and
   forming a second bump structure by bonding the copper post bump with another bump on the substrate.

16. The method of claim 15, wherein forming the first bump structure and the second bump structure involves reflowing solder layer in each bump structure to form a reflowed solder layer.

17. The method of claim 14, wherein the C4 bump of the first chip has a width greater than about 40 μm and equal to or less than about 120 μm and the plurality of bumps of the substrate has a width in a range from about 5 μm to about 30 μm.

18. The method of claim 14, further comprising:
   forming memory devices on the first chip before the first chip is provided.

19. The method of claim 14, further comprising:
   forming through silicon vias (TSVs) on the substrate before the substrate is provided.

20. The method of claim 15, wherein the first and the second bump structures are formed by reflowing solder in the first and second bump structures at the same time.

* * * * *